(12) United States Patent
Pradeep et al.

(10) Patent No.: US 6,300,251 B1
(45) Date of Patent: Oct. 9, 2001

(54) REPEATABLE END POINT METHOD FOR ANISOTROPIC ETCH OF INORGANIC BURIED ANTI-REFLECTIVE COATING LAYER OVER SILICON

(75) Inventors: Yelehanka Ramachandramurthy Pradeep, Singapore (SG); Vijakomar Chhagan, Belgrave (GB); Henry Gerung, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/501,967

(22) Filed: Feb. 10, 2000

(51) Int. Cl.$^7$ .................. H01L 21/302; H01L 21/461
(52) U.S. Cl. .................. 438/710; 438/733; 438/715; 438/719; 438/723; 438/299
(58) Field of Search ................ 438/710, 733, 438/715, 719, 723, 299, 592

(56) References Cited

U.S. PATENT DOCUMENTS

| | | |
|---|---|---|
| 5,188,980 | 2/1993 | Lai ........................... 437/193 |
| 5,453,156 | 9/1995 | Cher et al. ................ 156/643.1 |
| 5,767,018 * | 6/1998 | Bell . |
| 5,804,088 | 9/1998 | McKee ...................... 216/47 |
| 5,858,621 | 1/1999 | Yu et al. ................... 430/313 |
| 5,885,902 | 3/1999 | Blasingame et al. .......... 438/738 |
| 6,008,139 * | 12/1999 | Pan et al. . |
| 6,066,567 * | 5/2000 | En et al. . |
| 6,081,334 * | 6/2000 | Grimbergen et al. . |
| 6,103,632 * | 8/2000 | Kumar et al. . |
| 6,107,206 * | 8/2000 | Chao et al. . |
| 6,121,123 * | 9/2000 | Lyons et al. . |
| 6,133,156 * | 10/2000 | Langley . |
| 6,136,211 * | 10/2000 | Qian et al. . |
| 6,159,860 * | 12/2000 | Yang et al. . |

OTHER PUBLICATIONS

S.M. Sze, "VLSI Technology", Second Edition, McGraw–Hill International Editions, New York, NY, 1988, p. 200.

* cited by examiner

*Primary Examiner*—Charles Bowers
*Assistant Examiner*—Stephen W. Smoot
(74) *Attorney, Agent, or Firm*—George O. Saile; Rosemary L. S. Pike

(57) ABSTRACT

A method for anisotropically etching a partially manufactured semiconductor structure, more specifically, a stacked FET gate structure containing a bottom anti-reflective coating (Barc) layer is described. The structure is covered with a photoresist layer which is patterned to defines the gate region. The processing chemistry is predominantly carbon tetrafluoride, ($CF_4$) with the inclusion of chlorine ($Cl_2$) where fluorine (F) is generated in the plasma as the etchant for the structure. During processing, the wafer is cooled with helium (He) that lowers the wafer temperature and promotes sidewall deposition from the fluorine species which acts as a passivation layer producing a anisotropic or vertical etch profile. The process reduces etch time and results in very repeatable end point control of the Bark etch and poly cap etch improving the control of the structure critical dimensions and improving process throughput. The reduction in the use of fluorine based species reduces any potential environmental impact.

31 Claims, 2 Drawing Sheets

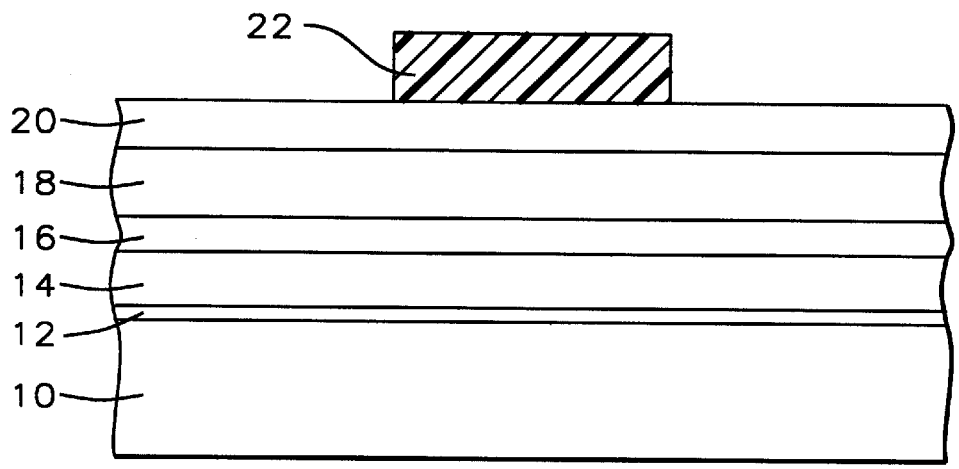
FIG. 1
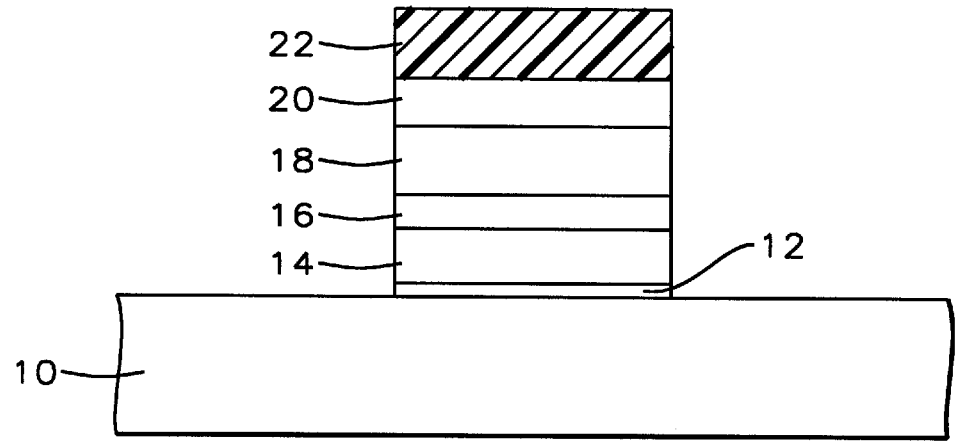
FIG. 2 - Prior Art
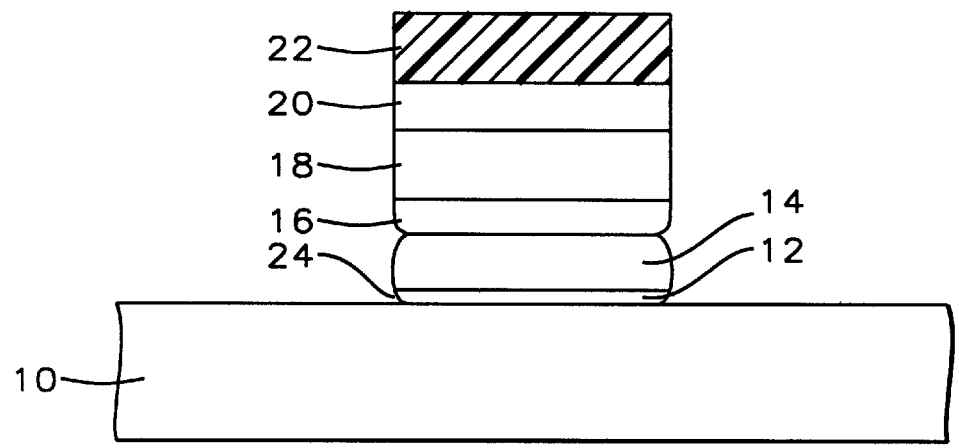
FIG. 3 - Prior Art

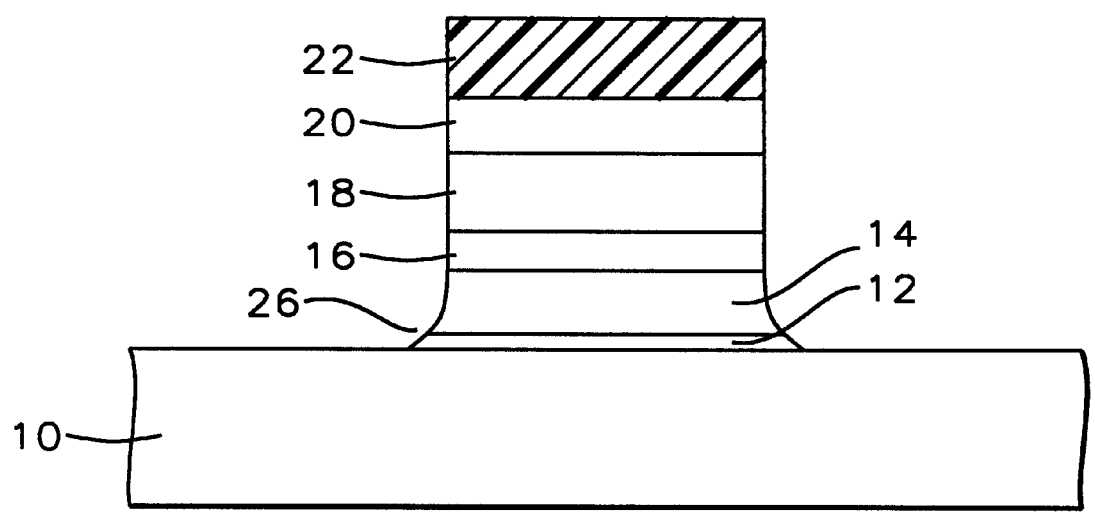
FIG. 4 – Prior Art

REPEATABLE END POINT METHOD FOR ANISOTROPIC ETCH OF INORGANIC BURIED ANTI-REFLECTIVE COATING LAYER OVER SILICON

BACKGROUND OF THE INVENTION (1) Fields of the Invention

The present invention relates generally to fabrication of semiconductor devices and more particularly to a anisotropic etch process for a multilayer silicon self aligned gate (SAG) for metal oxide semiconductor field effect transistor (MOSFET) where the etching process of the inorganic buried anti-reflective coating (Barc) layer over silicon results in repeatable etch time end points for the removal of the Barc.

(2) Description of Prior Art

The stacked gate multilayer structure of the current reduced size FET's has become common. As device size is reduced the etching process required to create the correct topography has become more critical.

Dry etching is a process in which a gas or plasma containing at least one reactive species which is energized by a radio frequency when placed in contact with a structure to be etched. This causes a reaction at the surface of the material to be etched wherein the reactant material is removed in the form of a gas. The status of the etch process as it progresses through the various materials of a multilayer gate element is monitored by an optical detector which monitors the optical emission from the plasma. The process begins with an application of a masking material such as photoresist (PR) on a multilayer semiconductor structure. The masking material patterns an area on the structure from the etch process, for instance, to create a field effect transistor (FET) gate structure. The structure or wafer is placed in a plasma reactor, that is, etcher, and etching is initiated. Two common problems with this dry etch process is the undercutting of the polysilicon gate layer, and the etch consistency of the process as it etches through the various layers of a composite layer gate structure. Another potentially serious environmental problem is the use of a reactant such as carbon tetrachloride ($CCl_4$), which can be potentially harmful to the environment as an ozone destroying chemical.

A common silicon/polysilicon etch process is based on fluorine. When mixtures such as carbon tetrafluoride ($CF_4$) and oxygen ($O_2$) are disassociated in an electrical discharge, fluorine atoms are liberated and volatilize the silicon as silicon tetrafluoride ($SiF_4$), Nevertheless, these processes are isotropic, that is they etch in all directions, laterally as well as vertically. with the same rate. Anisotropic or vertical only etches are not produced when fluorine is the sole enchant.

For vertical (anisotropic) etches of silicon or polysilicon, the uses of gas mixtures such as $CF_4$ and chlorine ($Cl_2$) are used. The recombinants suppress etching in the lateral, that is in the horizontal direction, by recombining with the $Cl_2$ atoms which have adsorbed on the etched polysilicon walls. Etching continues in the vertical direction perpendicular to the wafer surface because bombardment from the plasma suppresses the recombination mechanism. This sidewall passivation effect is described by S. M. Sze in his book VLSI Technology, Second Edition, McGraw-Hill International Editions, New York, N.Y. 1988, page 200.

Furthermore, the selectivity of etch between polysilicon and gate oxide (poly:oxide selectivity) must be as high as possible to minimize oxide loss. In addition to an etch step, most conventional processes include an overetch step. Overetching is necessary in order to insure no unwanted residues are left on the wafer or device structure after etching. If etching was stopped at the "end point" as determined by the optical emission from the plasma, only parts of the wafer would be completely etched while other parts would still be covered by some remaining polysilicon or buried or bottom anti reflective coating layer (Barc) material. The Barc layer is used to both help planarize the surface and to reduce light scattering from the semiconductor surface into the resist which helps in the definition of small images. The after etch residue is due to the non uniformity of both the initial polysilicon or Barc film thickness and the etch rate. Many of the overetch process gases contain chloride such as $CCl_4$ which can be harmful to the environment as an ozone destroying chemical as previously noted.

FIG. 2 illustrates an acceptable polysilicon etch profile. Substrate 10 is covered by a gate oxide 12, polysilicon gate 14, silicide 16, another poly layer 18 covered by a "buried" or bottom antireflective coating layer (Barc) 20 and photoresist 22. The polysilicon gate sidewall is vertical; it is not undercut 24 as shown in FIG. 3, nor does it have a "foot" 26 at the base of the poly gate as shown in FIG. 4. Both undercutting and foot formation result from complicated etch (isotropic and anisotropic) and deposition reactions. For example, the undercutting can result from enhanced isotropic etching near the bottom of the structure. Foot formation can be caused by redeposition which can have a higher rate at the bottom of a small etching region. It is common industry practice to eliminate "foot" formation with polysilicon gates by performing an overetch step after the main etch step. The overetch consumes the foot as well as any residual polysilicon on the oxide surface. In order to prevent undercutting, it is necessary to form a deposit on the polysilicon sidewall to protect the side wall from ions in the plasma which can laterally etch the sidewall. A process is desirable that produces the proper gate profile without undercutting and other anomalies such as a "foot", which uses chemical gases which are not harmful to the environment or reduce the quantities used of potentially harmful gases, and is reproducible over many different wafers during a manufacturing process.

The following terms and abbreviations are or may be used herein; Polysilicon (poly); Carbon (C); Carbon Tetrachloride ($CCl_4$); Carbon Tetrafluoride ($CF_4$); Chlorine ($Cl_2$); Fluorine (F); field effect transistor (FET); Helium (He); Hydrogen ($H_2$); milli Torr (mT); standard cubic centimeters per minute (sccm); Angstroms (Å); microns ($\mu$m); watts (w); etch rate (ER); seconds (sec); ratio of one element (X) to another (Y) (X:Y), bottom (or buried) anti-reflective coating (Barc), Centigrade (°C.), self aligned gate (SAG).

U.S. Pat. No. 5,804,088 issued to McKee and U.S. Pat. No. 5,858,621 issued to Yu et al show methods for etching multilayer FET gate structures containing anti-reflective coating layer(s), U.S. Pat. No. 5,885,902 issued to Blasingame et al. shows for etching a multilayer gate structure containing an arc layer with different reactant gases. U.S. Pat. No. 5,188,980 issued to Lai describes an inert gas purge enchant process for a multilayer gate structure. U.S. Pat. No. 5,453,156 issued to Cher et al. describes a multilayer gate element dry anisotropic etch eliminating $CCl_4$ from the enchant chemistry.

SUMMARY OF THE INVENTION

Accordingly, it is the primary objective of the invention to provide an effective and manufacturable process for dry etching a multilayer semiconductor structure that produces improved endpoint repeatability of the etch rate for the various semiconductor material layers, and more particularly, Barc etch repeatability and the etch repeatability of the optional poly layer if used in the structure design.

It is also the objective of this invention to provide a vertical, or anisotropic etch of the multilayer gate structure without undercutting or foot formation.

A further object of this invention is to reduce the use of process chemicals that could possibly have an environmental concern.

In accordance with objects of the invention a method for anisotropically etching a stacked FET gate structure containing a bottom anti-reflective coating (Barc) layer is achieved. The structure is covered with a photoresist layer which is patterned to defines the gate region. The processing chemistry is predominantly carbon tetrafluoride, ($CF_4$) with the inclusion of chlorine ($Cl_2$) where fluorine (F) is generated in the plasma as the etchant for the structure. During processing, the wafer is cooled with helium (He) that lowers the water temperature and promotes sidewall deposition which acts as a passivation layer producing a anisotropic etch.

BRIEF DESCRIPTION OF THE DRAWINGS

FIG. 1 shows a cross section through a typical field effect transistor stacked gate structure with a patterned photoresist top layer prior to gate structure etching.

FIG. 2 is a cross section view of an ideal gate structure after etching.

FIG. 3 is a cross section view of a prior art semiconductor device showing the effects of undercutting during the etching process.

FIG. 4 is a cross section view of a prior art semiconductor device showing the effects of undercutting.

DESCRIPTION OF THE PREFERRED EMBODIMENTS

Referring to FIG. 1 a cross sectional view of a partially completed integrated circuit is shown. A substrate 10 composed of monocrystalline silicon forms the basis of the structure. A thin silicon dioxide ($SiO_2$) layer 12, typically the gate oxide layer, overlays the substrate 10. This layer 12 may have a thickness of between 10 and 100 Å. Overlaying this oxide dielectric layer 12 is a polysilicon layer 14 which may be composed of silicon doped with phosphorous and may have a thickness of between 500 to 2500 Å Overlaying the poly layer 14 is a tungsten silicide (Wsix) layer 16 of thickness between 500 AND 1500 Å. As an option if required by the design, there can be on top of this Wsix layer 16 another poly layer 18 sometimes referred to as the 'poly cap', typically between 500 and 1000 Å in thickness. These layers comprise the essential elements of the multilayer silicon gate element. Layer 20 is the Barc Layer which improves the photolithography patterning process and is typically between 100 and 800 Å in thickness, and typically composed of an inorganic material such as $Si_xO_yN_z$ or $Ti_xN_y$. Layer 22 is a patterned photoresist layer used to create a pattern in the underlying structure layers.

A wafer to be etched is placed between the lower and upper electrodes or plates in a transformer coupled plasma (TCP) dry etch chamber such as manufactured by the Lam Research Corporation. For the first step, a nominal vacuum of 10 mT is provided by the chamber vacuum pump. The temperature inside the chamber is maintained between about 20° and 65° degrees centigrade (° C.). During the plasma-on operation the gap between the lower and upper electrode plates is preferably between about 5 and 30 cm. Chlorine, helium and carbon tetrafluoride gases flow into the chamber through gas feed valves the flow rate of which is controlled by Mass Flow Controllers (MFC) which adjust the gas flow according to electronic signals from a computer. The nominal flow rate for the Barc etch is between about 27 to 33 sccm of chlorine, between about 45 and 55 sccm of $CF_4$, and between about 45 and 55 sccm of He. The appropriate nominal molar equivalent gas mixture ratios would be 3:5:5. These quantities can be varied ±10% to allow for machine and material variations. A suitable radio frequency (RF) generator with a power of between about 150 and 500 watts is applied. The first step lasts until the Barc is removed. The endpoint detector is a photodiode which observes the light emitted during the process as measured in counts. A wavelength typically utilized by the detector is 405 nm. When the Barc layer has been etched through, the light emission intensity increases, and continues to increase during the poly cap layer etch. The poly cap layer is sometimes not required for the structure, and can therefore be considered optional for the structure. The 100% overetch is performed with the same gas mixture and flow rates as the Barc and poly etches. The emission intensity begins to decrease at the poly cap etch endpoint. The prior process produced less discrimination in emission intensity as more wafers were processed, and resulted in increasing etch endpoint times. This undesirable characteristic could impact the quality of the resulting etched device and device critical dimensions. The process of the invention improves emission intensity discrimination for the various layers as well as reduces the initial Barc and Barc and poly cap end point etch times which also reduces the quantity of fluorine used reducing any potential environmental impact.

The following summarizes the conventional or prior art process and the new process described by the invention.

TABLE 1

PRIOR ART: Conventional Barc Etch Process Nominal Parameters

| STEP | Pressure mTorr | Power Watts* | Plate Spacing cm | Flow rate sccm/Gas |
| --- | --- | --- | --- | --- |
| Start Barc etch | 10 | TCP - 200<br>BP - 150 | 8.1 | 50/$CF_4$ - 100/He |
| Main Bark etch | 10 | TCP - 200<br>BP - 150 | 8.1 | 50/$CF_4$ - 100/He |
| Overetch | 10 | TCP - 200<br>BP - 150 | 8.1 | 50/$CF_4$ - 100/He |

TABLE 2

NEW PROCESS: Invention Barc Etch Process Nominal Parameters

| STEP | Pressure mTorr | Power Watts* | Plate Spacing cm | Flow rate sccm/Gas |
| --- | --- | --- | --- | --- |
| Start Barc etch | 10 | TCP - 200<br>BP - 150 | 8.1 | 30/$CL_2$- 50/$CF_4$-50/He |
| Main Bark etch | 10 | TCP - 200<br>BP - 150 | 8.1 | 30/$CL_2$- 50/$CF_4$-50/He |
| Overetch | 10 | TCP - 20()<br>BP - 150 | 8. 1 | 30/$CL_2$- 50/$CF_4$-50/He |

*NOTE: Etchiing power (watts); TCP = Transformer Coupled (top) Plate; BP = Bottom Plate Barc etch endpoint time in seconds as monitored by the optical detector with a typical wavelength of 405 nanometers (nm) is shown below for the previous process and the new process described by the invention. It is noted that for the previous process the variation in etch end point times varies from 50 seconds to 77 seconds over 15 wafers, a nominal 54 percent change in end point time. The process of the invention varies nominally by ± two seconds or typically less that 6% over a run of 15 wafers. It should be noted that the new process takes less time to complete the etch. This has the potential to improve throughput and to reduce the amount of gas being used, desirable attributes for cost improvement and to reduce the environmental effect.

TABLE 3

PRIOR ART: Barc etch endpoint times* vs. the number of wafers processed.

| Wafer number | 1 | 2 | 5 | 10 | 12 | 15 |
|---|---|---|---|---|---|---|
| Barc structure endpoint etch time (sec.) | 50 | 52 | 55 | 64 | 66 | 77 |

TABLE 4

NEW PROCESS: Barc etch endpoint times* vs. the number of wafers processed.

| Wafer number | 1 | 2 | 5 | 10 | 12 | 15 |
|---|---|---|---|---|---|---|
| Barc structure endpoint etch time sec.) | 35 | 33 | 34 | 35 | 36 | 36 |

*NOTE: Times are typical and representative, but can vary from lot to lot due to normal potential variation in power, flow and other processmg parameters.

While the invention has been particularly shown and described with reference to the preferred embodiments thereof, it will be understood by those skilled in the art that various changes in form and details may be without departing from the spirit and scope of the invention.

What is claimed:

1. The process of etching a first and second layer on a multilayer self aligned gate structure on a suitable substrate through a patterned resist layer which will have a repeatable end point and reduced etch end point time which process comprises:

etching said layers with a gas flow mixture of chlorine ($Cl_2$) and carbon tetrafluoride ($CF_4$) and helium (He) gases into a plasma reactive etching chamber containing said gate structure;

detecting the etch endpoint of said first layer;

etching said second layer of said gate structure with the same gas mixture;

detecting the endpoint of said second layer etch;

performing a 100% over etch to assure no residue of said layers remains;

completing the etching and fabrication of said gate structure.

2. The process of claim 1 wherein said first layer is an inorganic bottom antireflective coating layer (Barc) composed of $Si_xO_yN_z$ to a thickness of between 100 and 500 Å.

3. The process of claim 1 wherein said second layer is a polysilicon (poly) layer to a thickness of between 500 and 1000 Å.

4. The process of claim 1 wherein the flow of said $Cl_2$ is between 10 and 100 sccm.

5. The process of claim 1 in which the flow of said $CF_4$ is between 10 and 100 sccm.

6. The process of claim 1 in which the flow of said He gas is between 10 and 200 sccm.

7. The process of claim 1 whereby the molar ratio of said $Cl_2$ to $CF_4$ to He is 3:5:5.

8. The process of claim 1 in which during the flow of said gases the radio frequency power of said plasma reactive etching chamber is between 100 and 500 watts for an upper plate, and between 50 and 500 watts for a bottom plate.

9. The process of claim 1 in which said etch chamber is a vacuum chamber and has a vacuum of less that 100 mT and a temperature between 20 and 100° C.

10. The process of claim 1 whereby the wavelength of a photodiode optical detector used to detect etching endpoints is between 200 and 500 nm.

11. The process of etching a SAG gate structure from a multilayer structure patterned with photoresist on top of a first layer consisting of a Barc material, and a second layer consisting of polysilicon cap, which said process minimizes or eliminates the undercutting of the polysilicon layer and minimizes Barc etch time which process consists of:

etching said first layer with a gas flow mixture of chlorine ($Cl_2$) and carbon tetrafluoride ($CF_4$) and helium (He) gases into a plasma reactive etching chamber containing said gate structure;

detecting the etch endpoint of said first layer;

etching said second layer of said gate structure with the same gas mixture;

passivating a sidewall with a polymer coating created by the fluorine based species while cooling the structure with He providing an anisotropic etch profile;

detecting the endpoint of said second layer etch;

performing an 100% over etch to assure no residue of said layers remains;

completing the etching and fabrication of said gate structure.

12. The process of claim 11 wherein said Barc layer is composed of $Si_2O_yN_z$ to a thickness of between 100 and 500 Å.

13. The process of claim 11 wherein said second layer is a polysilicon (poly) layer to a thickness of between 500 and 1000 Å.

14. The process of claim 11 wherein the flow of said $Cl_2$ is between 10 and 100 sccm.

15. The process of claim 11 in which the flow of said $CF_4$ is between 10 and 100 sccm.

16. The process of claim 11 in which the flow of said He gas is between 10 and 200 sccm.

17. The process of claim 11 whereby the molar ratio of said $Cl_2$ to $CF_4$ He is 3:5:5.

18. The process of claim 11 whereby the flow of said cooling He is between 10 and 200 sccm.

19. The process of claim 11 in which during the flow of said gases the radio frequency power of said plasma reactive etching chamber is between 100 and 500 watts. for an upper plate, and between 50 and 500 watts for a bottom plate.

20. The process of claim 11 in which said etch chamber is a vacuum chamber and has a vacuum of less than 100 mT and a temperature between 20 and 100° C.

21. The process of claim 11 whereby the wavelength of a photodiode optical detector used to detect etching endpoints is between 200 and 500 nm.

22. The process of etching a SAG gate from a multilayer structure containing a top first Barc layer followed by tungsten silicide, polysilicon and gate oxide layers which process minimizes the variation in structure critical as well as dimensions as well as preserving the proper integrity of the multilayer elements by producing a well controlled Barc etch which process consists of:

etching said first Barc layer with a gas flow mixture of chlorine ($Cl_2$) and carbon tetrafluoride ($CF_4$) and helium (He) gases into a plasma etching chamber containing said gate structure;

detecting the etch endpoint of said first Barc layer;

cooling said gate structure with He to enable sidewall passivation from polymer created by said fluorine species during etching providing an anisotropic etch profile;

performing an 100% over etch to assure no residue of said first layer remains;

completing the etching and fabrication of said gate structure.

23. The process of claim 22 wherein said first Barc layer is composed of $Si_xO_yN_z$ to a thickness of between 100 and 500 Å.

24. The process of claim 22 wherein the flow of said $Cl_2$ is between 10 and 100 sccm.

25. The process of claim 22 in which the flow of said $CF_4$ is between 10 and 100 sccm.

26. The process of claim 22 in which the flow of said He gas is between 10 and 200 sccm.

27. The process of claim 22 whereby the molar ratio of said $Cl_2$ to $CF_4$ to He is 3:5:5.

28. The process of claim 22 whereby the flow of said cooling He gas is between 10 and 200 sccm.

29. The process of claim 22 in which during the flow of said gases the radio frequency power of said plasma reactive etching chamber is between 100 and 500 watts for an upper plate, and between 50 and 500 watts for a bottom plate.

30. The process of claim 22 in which said etch chamber is a vacuum chamber and has a vacuum of less than 100 mT and a temperature between 20 and 100° C.

31. The process of claim 22 whereby the wavelength of a photodiode optical detector used to detect etching endpoints is between 200 and 500 nm.

* * * * *